(12) United States Patent
Izawa et al.

(10) Patent No.: US 8,961,827 B2
(45) Date of Patent: *Feb. 24, 2015

(54) RED FLUORESCENT MATERIAL, METHOD FOR PRODUCING RED FLUORESCENT MATERIAL, WHITE LIGHT SOURCE, ILLUMINATING DEVICE, AND LIQUID CRYSTAL DISPLAY

(75) Inventors: Takamasa Izawa, Tokyo (JP); Tsuneo Kusunoki, Tokyo (JP)

(73) Assignee: Dexerials Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/814,671

(22) PCT Filed: Dec. 28, 2011

(86) PCT No.: PCT/JP2011/080507
§ 371 (c)(1), (2), (4) Date: Feb. 6, 2013

(87) PCT Pub. No.: WO2012/091134
PCT Pub. Date: Jul. 5, 2012

(65) Prior Publication Data
US 2013/0154470 A1    Jun. 20, 2013

(30) Foreign Application Priority Data

Dec. 28, 2010 (JP) ................................ 2010-293419
May 14, 2011 (JP) ................................ 2011-108873

(51) Int. Cl.
C09K 11/65 (2006.01)
C09K 11/08 (2006.01)
(Continued)

(52) U.S. Cl.
CPC ......... C09K 11/7734 (2013.01); C09K 11/0883 (2013.01); H05B 33/12 (2013.01); H01L 33/501 (2013.01); Y02B 20/181 (2013.01); G02F 1/133603 (2013.01)
USPC ....................... 252/301.4 F; 313/503; 257/98

(58) Field of Classification Search
USPC ....................... 252/301.4 F; 257/89; 313/503
See application file for complete search history.

(56) References Cited

U.S. PATENT DOCUMENTS

2011/0176084 A1* 7/2011 Akiho et al. .................... 349/61

FOREIGN PATENT DOCUMENTS

| JP | 2002-60747 A | 2/2002 |
| JP | 2005-235934 A | 9/2005 |

(Continued)

OTHER PUBLICATIONS

International Search Report issued in PCT/JP2011/080507 mailed Feb. 14, 2012 (2 pages).

*Primary Examiner* — Carol M Koslow
(74) *Attorney, Agent, or Firm* — Osha Liang LLP

(57) ABSTRACT

The present invention provides an efficient red fluorescent material and a method for producing the same, provides a white light source and an illuminating device each of which uses this red fluorescent material to achieve snow-white lighting, and furthermore provides a liquid crystal display having excellent color reproduction. The red fluorescent material contains an element (A), europium (Eu), silicon (Si), carbon (C), oxygen (O), and nitrogen (N), at an atomic ratio of the following in compositional formula (1).

$$[A_{(m-x)}Eu_x][Si_{(9-y)}C_y]O_nN_{[12-2(n-m)/3]}$$

Note that, in the compositional formula (1), element A is group 2 element including at least calcium (Ca) and strontium (Sr). Also, note that, in the composition formula (1), m, x, y, and n satisfy $3<m<5$, $0<x<1$, $0<y<9$, and $0<n<10$, respectively.

Such red fluorescent material is able to improve quantum efficiency, compared with a red fluorescent material which does not contain calcium (Ca) but contains strontium (Sr) as the element A.

6 Claims, 16 Drawing Sheets

(51) Int. Cl.
*F21S 2/00* (2006.01)
*F21V 9/16* (2006.01)
*G02F 1/13357* (2006.01)
*H01L 33/50* (2010.01)
*C09K 11/77* (2006.01)
*H05B 33/12* (2006.01)
*G02F 1/1335* (2006.01)

(56) References Cited

FOREIGN PATENT DOCUMENTS

| | | |
|---|---|---|
| JP | 3931239 B2 | 6/2007 |
| JP | 2011-1530 A | 1/2011 |
| WO | 2009/050171 A2 | 4/2009 |
| WO | WO 2010/002015  * | 1/2010 |

* cited by examiner

RED FLUORESCENT MATERIAL, METHOD FOR PRODUCING RED FLUORESCENT MATERIAL, WHITE LIGHT SOURCE, ILLUMINATING DEVICE, AND LIQUID CRYSTAL DISPLAY

FIELD OF THE INVENTION

The present invention relates to a red phosphor and a method for producing the same, and furthermore relates to a white light source using a red phosphor, an illuminating device, and a liquid crystal display. The present application claims priority rights to JP Patent Application 2010-293419 filed in Japan on Dec. 28, 2010, and JP Patent Application 2011-108873 filed in Japan on May 14, 2011, which are hereby incorporated by reference.

BACKGROUND OF THE INVENTION

For backlights of illuminating devices and liquid crystal displays, a white light source configured of a light emitting diode is used. As such white light source, there has been known a white light source in which a cerium-containing yttrium aluminum garnet (hereinafter, referred to as YAG:Ce) PHOSPHOR is arranged on the luminescence surface side of a blue light-emitting diode (hereinafter, referred to as a blue LED).

In addition to this, there has been known a white light source in which green and red sulfide phosphors are arranged on the luminescence surface side of a blue LED (For example, refer to PTL 1). Furthermore, there has been known a configuration of a white light source in which, on the luminescence surface side of a LED which emits light in blue-violet or blue, a phosphor substance obtained by solid-dissolving Mn, Eu, and the like into a $CaAlSiN_3$ crystal is arranged with another phosphor substance in combination at a specified proportion (For example, refer to PTL 2).

PRIOR-ART DOCUMENTS

Patent Document

PTL 1: Japanese Patent Application Laid-Open No. 2002-60747
PTL 2: Japanese Unexamined Patent Publication No. 3931239

SUMMARY OF THE INVENTION

However, a white light source in which a YAG:Ce phosphor is arranged on the luminescence surface side of a blue LED does not contain a red component in an emission spectrum of the YAG:Ce phosphor, and therefore emits bluish white light and has a narrow color gamut. Hence, it is difficult to illuminate a snow-white color by an illuminating device configured of this white light source. Also, in a liquid crystal display using this white light source as a backlight, it is difficult to perform display excellent in color reproduction.

In a white light source in which green and red sulfide phosphors are arranged on the luminescence surface side of a blue LED, a sulfide red phosphor is hydrolyzed, whereby luminance deteriorates with the passage of time. Therefore, in an illuminating device and a liquid crystal display which are configured of this white light source, it is difficult to perform lighting and display with high quality in which deterioration of luminance is prevented.

Furthermore, in a white light source which uses a phosphor substance obtained by solid-dissolving Mn, Eu, and the like into a $CaAlSiN_3$ crystal, time and effort to mix and use two kinds of phosphors are required.

The present invention is proposed in view of such background, and aims of the present invention are to provide an efficient red fluorescent material and a method for producing the same, to provide a white light source and an illuminating device each of which uses this red fluorescent material to achieve snow-white lighting, and furthermore, to provide a liquid crystal display having excellent color reproduction.

Inventors of the present invention studied earnestly and found that quantum efficiency can be improved by adding calcium (Ca) and strontium (Sr) to a red phosphor containing europium (Eu), silicon (Si), carbon (C), oxygen (O), and nitrogen (N).

That is, a red fluorescent material according to the present invention contains an element A, europium (Eu), silicon (Si), carbon (C), oxygen (O), and nitrogen (N), at an atomic ratio of the following composition formula (1).

[Chemical Formula 1]

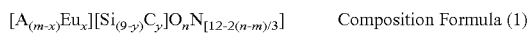

$$[A_{(m-x)}Eu_x][Si_{(9-y)}C_y]O_nN_{[12-2(n-m)/3]}\qquad \text{Composition Formula (1)}$$

Note that, in the composition formula (1), the element A is a group 2 element including at least calcium (Ca) and strontium (Sr). Also, note that, in the composition formula (1), m, x, y, and n satisfy $3<m<5$, $0<x<1$, $0<y<9$, and $0<n<10$, respectively.

A method for producing a red fluorescent material according to the present invention is performed in such a manner that a carbonate compound of the element A, europium nitride, silicon nitride, and melamine are mixed to form a mixture so that the element A, europium (Eu), silicon (Si), carbon (C), oxygen (O), and nitrogen (N) are contained at the atomic ratio of the composition formula (1), and burning of the mixture and pulverization of a burned material obtained by the burning are performed.

A white light source according to the present invention comprises a blue light-emitting diode formed on an element substrate, and a kneaded material which is obtained by kneading a red phosphor and a green phosphor with a transparent resin and is arranged on the blue light-emitting diode. The red phosphor contains the element A, europium (Eu), silicon (Si), carbon (C), oxygen (O), and nitrogen (N), at the atomic ratio of the composition formula (1).

An illuminating device according to the present invention is configured such that a plurality of white light sources is arranged on an illumination board. The white light source comprises a blue light-emitting diode formed on an element substrate, and a kneaded material which is obtained by kneading a red phosphor and a green phosphor with a transparent resin and is arranged on the blue light-emitting diode. The red phosphor contains the element A, europium (Eu), silicon (Si), carbon (C), oxygen (O), and nitrogen (N) at the atomic ratio of the composition formula (1).

A liquid crystal display according to the present invention comprises a liquid crystal display panel, and a backlight using a plurality of white light sources which illuminates the liquid crystal display panel. The white light source has a blue light-emitting diode formed on an element substrate, and a kneaded material which is obtained by kneading a red phosphor and a green phosphor with a transparent resin and is arranged on the blue light-emitting diode. The red phosphor contains the element A, europium (Eu), silicon (Si), carbon (C), oxygen (O), and nitrogen (N), at the atomic ratio of the composition formula (1).

Effects of the Invention

The red fluorescent material according to the present invention bears the above-mentioned characteristics, and thereby has a luminescence peak wavelength in a red wavelength band (for example, a wavelength band of 620 nm to 770 nm), and is capable of emitting red light highly efficiently.

Since the white light source according to the present invention uses a highly efficient red phosphor, white light having a wide color gamut and brightness can be achieved by three primary colors of red light from this red phosphor, green light from a green phosphor, and blue light from a blue light-emitting diode.

Since the illuminating device according to the present invention uses the white light source having a wide color gamut and brightness, pure white illumination with high luminance is capable of being performed.

The liquid crystal display according to the present invention illuminates a liquid crystal display panel by applying the white light source having a wide color gamut and brightness to a backlight to illuminate a liquid crystal display panel, whereby a pure white color with high luminance can be achieved in a display screen of the liquid crystal display panel, and a display having a high quality image with excellence in color reproduction can be performed.

DETAILED DESCRIPTION OF THE INVENTION

Figure 1:
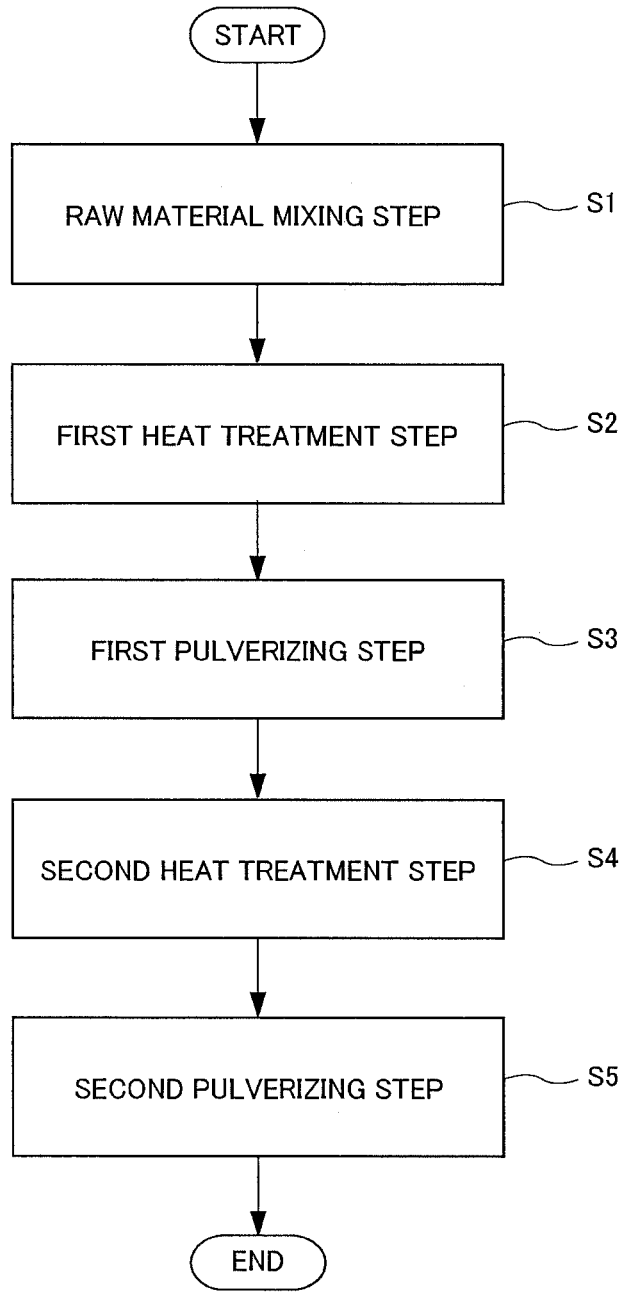
FIG. 1 is a flow chart showing a method for producing a red fluorescent material according to one embodiment of the present invention.

Hereinafter, an embodiment of the present invention will be described in detail in the following order, with reference to the drawings.

1. Configuration of Red Phosphor
2. Method for Producing Red Phosphor
3. Configuration Example of White Light Source
4. Configuration Example of Illuminating Device
5. Configuration Example of Liquid Crystal Display
6. Examples

1. Configuration of Red Phosphor

A red phosphor according to one embodiment of the present invention contains an element A, europium (Eu), silicon (Si), carbon (C), oxygen (O), and nitrogen (N), at an atomic ratio of the following composition formula (1).

[Chemical Formula 2]

$$[A_{(m-x)}Eu_x][Si_{(9-y)}C_y]O_nN_{[12-2(n-m)/3]} \quad \text{Composition Formula (1)}$$

Note that, in the composition formula (1), the element A is a group 2 element including at least calcium (Ca) and strontium (Sr). Also, in the composition formula (1), m, x, y, and n satisfy $3<m<5$, $0<x<1$, $0<y<9$, and $0<n<10$, respectively. When each of atomic ratios of Ca, Sr, and another group 2 element (magnesium (Mg), barium (Ba)) is $\alpha$, $\beta$, and $\gamma$, respectively, it is satisfied that $m=\alpha+\beta+\gamma$, and $0<\alpha/(\alpha+\beta)<1$.

In this composition formula (1), an atomic ratio of the sum of silicon and carbon is fixed at 9. An atomic ratio of nitrogen (N) in the composition formula (1) $[12-2(n-m)/3]$ is calculated so that the sum of atomic ratios of each element in the composition formula (1) is neutral. In other words, when an atomic ratio of nitrogen (N) in the composition formula (1) is δ, and the charges of each element constituting the composition formula (1) are compensated, $2(m-x)+2x+4\times9-2n-3\delta=0$. Thus, the atomic ratio of nitrogen (N) is calculated such that $\delta=12-2(n-m)/3$.

The red phosphor represented by this composition formula (1) is constituted by a crystal structure belonging to an orthorhombic space group Pmn21, and contains carbon (C) as one of constituent elements. By making carbon contained, excessive oxygen (O) in a generation process is removed, and an amount of oxygen is controlled.

Such red phosphor improves quantum efficiency, compared with a red phosphor which does not contain calcium (Ca) but contains strontium (Sr) as the element A.

In the composition formula (1), when $\alpha/(\alpha+\beta)$ is on the horizontal axis and an integral value of luminescence amount is on the vertical axis, $\alpha/(\alpha+\beta)$ and y preferably satisfy a relation that inclination of the approximate straight-line of measured values is positive. Specifically, a carbon (C) content (y) is increased in accordance with an increase in a calcium (Ca) content ($\alpha/(\alpha+\beta)$), whereby, with the increase in the calcium (Ca) content ($\alpha/(\alpha+\beta)$), an integral value of luminescence amount is also higher, and the above-mentioned inclination of the approximate straight line can be positive. In other words, it is considered that, as a content of calcium (Ca) increases, a content of carbon (C), which should be contained in a phosphor increases in order to acquire high luminous efficiency, increases.

In the composition formula (1), a relation that $0<\alpha/(\alpha+\beta)\leq0.2$ is preferably satisfied. When a calcium (Ca) content ($\alpha/(\alpha+\beta)$) exceeds 20%, a carbon (C) content (y) needs to be increased in order to obtain a high integral value of luminescence amount, and accordingly it becomes difficult to obtain the high integral value of luminescence amount.

In the composition formula (1), a relation that $0.012\leq y\leq0.10$ is preferably satisfied.

When a carbon (C) content (y) exceeds 0.10, it becomes difficult to obtain a high integral value of luminescence amount. Also, when a carbon (C) content (y) is not less than 0.012, which is beyond a detection limit (approximately 0.007) to be a basis for measuring a carbon content in a red phosphor, a carbon effect, that is, an improvement in luminous efficiency, can be achieved by adjusting a ratio of carbon to other elements.

In a PLE (Photo Luminescence Excitation) spectrum, a relative value of a luminescence intensity of 550 nm excitation wavelength is preferably not more than 0.82 when a luminescence intensity of 400 nm excitation wavelength is defined as 1. In a PLE spectrum, a relative value of a luminescence intensity of 550 nm excitation wavelength when a luminescence intensity of 400 nm excitation wavelength is defined as 1 has a relation to a content of carbon (C), which should be contained in a phosphor in order to obtain a high luminous efficiency, and the relative value is not more than 0.82, preferably in a range of not more than 0.82 and not less than 0.70, whereby a high integral value of luminescence amount can be achieved.

2. Method for Producing Red Phosphor

Next, with reference to the flow chart shown in FIG. 1, a method for producing a red phosphor according to one embodiment of the present invention will be described below.

As shown in FIG. 1, a "raw material mixing step" S1 is performed first. In the raw material mixing step, first, melamine ($C_3H_6N_6$) is used as a raw material together with a raw material compound which contains elements constituting the composition formula (1), and mixed.

As the raw material compounds which contain elements constituting the composition formula (1), a carbonate compound of the element A [for example, strontium carbonate ($SrCO_3$), calcium carbonate ($CaCO_3$)], europium nitride (EuN), and silicon nitride ($Si_3N_4$) are prepared. Then, each of the prepared raw material compounds is weighed at a prescribed molar ratio so that the elements in the composition formula (1) contained in each of the raw material compounds satisfy the atomic ratio of the composition formula (1). Each of the weighed compounds is mixed together to form a mixture. Melamine is added as a flux at a prescribed ratio with respect to the sum of the total number of moles of strontium carbonate, europium nitride, and silicon nitride.

The mixture is formed by mixing, for example, in an agate mortar inside a glove box in nitrogen atmosphere.

Next, a "first heat treatment step" S2 is performed. In the first heat treatment step, the above-mentioned mixture is burned to form a first burned material, which is to be a precursor of a red phosphor. For example, the mixture is put in a crucible made of boron nitride, and a heat treatment is performed in hydrogen ($H_2$) atmosphere. In this first heat treatment step, for example, a heat treatment temperature is set at 1400 degrees C., and the heat treatment is performed for 2 hours. The heat treatment temperature and the heat treatment time may be suitably changed within a range where the above-mentioned mixture can be burned.

In the first heat treatment step, melamine, whose melting point is not more than 250 degrees C., is thermally decomposed. The carbon (C) and the hydrogen (H) resulting from the thermal decomposition are combined with a part of oxygen (O) contained in strontium carbonate to form carbon dioxide gas (CO or $CO_2$) or $H_2O$. Then, carbon dioxide gas and $H_2O$ are evaporated, whereby a part of oxygen is removed from strontium carbonate of the first burned material. Also, reduction and nitriding are promoted by nitrogen (N) contained in the decomposed melamine.

Next, a "first pulverizing step" S3 is performed. In the first pulverizing step, the above-mentioned first burned material is pulverized to form a first powder. For example, the first burned material is pulverized using an agate mortar inside a glove box in nitrogen atmosphere, and then, for example, is made to pass through a #100 mesh (having an opening of approximately 200 μm) to obtain the first burned material having an average particle diameter of 3 μm or less. Thus, nonuniformity in component is less prone to occur in a second burned material, which is to be formed in the next step, namely, a second heat treatment step.

Next, the "second heat treatment step" S4 is performed. In the second heat treatment step, the above-mentioned first powder is heat-treated to form the second burned material. For example, the first powder is put in a crucible made of boron nitride, and heat-treated in nitrogen ($N_2$) atmosphere. In the second heat treatment step, for example, the above-mentioned nitrogen atmosphere is pressurized, for example, to 0.85 MPa, a heat treatment temperature is set at 1800 degrees C., and the heat treatment is performed for 2 hours. The heat treatment temperature and the heat treatment time may be suitably changed within a range where the first powder can be burned.

Such second heat treatment step enables a red phosphor represented by the composition formula (1) to be obtained. The second burned material (a red phosphor) obtained by the second heat treatment step is a homogeneous material represented by the composition formula (1).

Next, a "second pulverizing step" S5 is performed. In the second pulverizing step, the above-mentioned second burned material is pulverized to form a second powder. For example, pulverizing is performed using an agate mortar inside a glove box in nitrogen atmosphere, and the second burned material is pulverized, for example, using a #420 mesh (having an opening of approximately 26 μm), for example, until an average particle diameter thereof becomes approximately 3.5 μm.

The method for producing a red phosphor enables impalpable powder of a red phosphor (for example, having an average particle diameter of approximately 3.5 μm) to be obtained. Thus, by making a red phosphor into powder, for example, when the red phosphor is kneaded together with powder of a green phosphor into a transparent resin, the red phosphor is uniformly kneaded.

Hence, there can be obtained a red phosphor which is represented by the composition formula (1) and contains each element at an atomic ratio where mixing is performed in the "raw material mixing step" S1. As shown in the following Example, this red phosphor has a luminescence peak wavelength in a red wavelength band (for example, a wavelength band of 620 nm to 770 nm).

3. Configuration Example of White Light Source

Next, the white light source according to one embodiment of the present invention will be described with reference to a simplified sectional view shown in FIG. 2.

Figure 2:
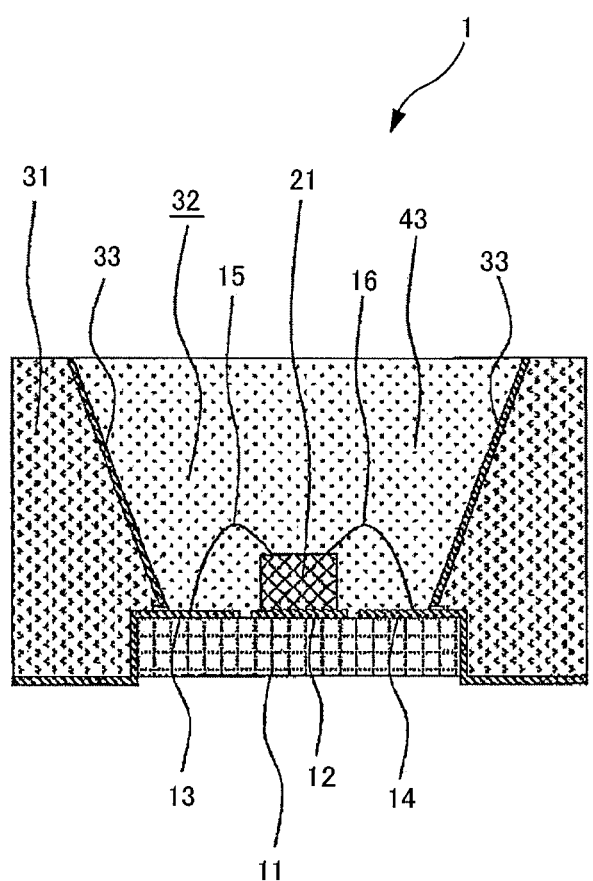
FIG. 2 is a simplified sectional view showing a white light source according to one embodiment of the present invention.

As shown in FIG. 2, a white light source 1 has a blue light-emitting diode 21 on a pad portion 12 formed on an element substrate 11. On the element substrate 11, electrodes 13 and 14, each of which supplies electric power to drive the blue light-emitting diode 21, are formed with insulation being maintained, and each of the electrodes 13 and 14 is connected to the blue light-emitting diode 21, for example, by lead wires 15 and 16, respectively.

A resin layer 31 is, for example, formed around the blue light-emitting diode 21, and an opening portion 32, which opens above the blue light-emitting diode 21, is formed in the resin layer 31.

In the opening 32, an inclined slope is formed in such a manner that an opening area becomes larger in a luminescence direction of the blue light-emitting diode 21, and a reflective film 33 is formed on the inclined slope. In other words, in the resin layer 31, which has the conical opening portion 32, the wall surface of the opening portion 32 is covered with the reflective film 33, while the light emitting diode 21 is arranged on the bottom of the opening portion 32. The white light source 1 is configured such that, inside the opening portion 32, a kneaded material 43, which is obtained by kneading a red phosphor and a green phosphor into a transparent resin, is embedded so as to cover the blue light-emitting diode 21.

As the red phosphor, a red phosphor represented by the composition formula (1) is used. This red phosphor has a luminescence peak wavelength in a red wavelength band (for example, a wavelength band of 620 nm to 770 nm), high luminescence intensity, and high luminance. Therefore, white light having a wide color gamut and brightness can be achieved by three primary colors of blue light from a blue light-emitting diode, green light from a green phosphor, and red light from the red phosphor.

4. Configuration Example of Illuminating Device

Next, the illuminating device according to one embodiment of the present invention will be described with reference to simplified plan views shown in FIG. 3A and FIG. 3B.

Figure 3A:
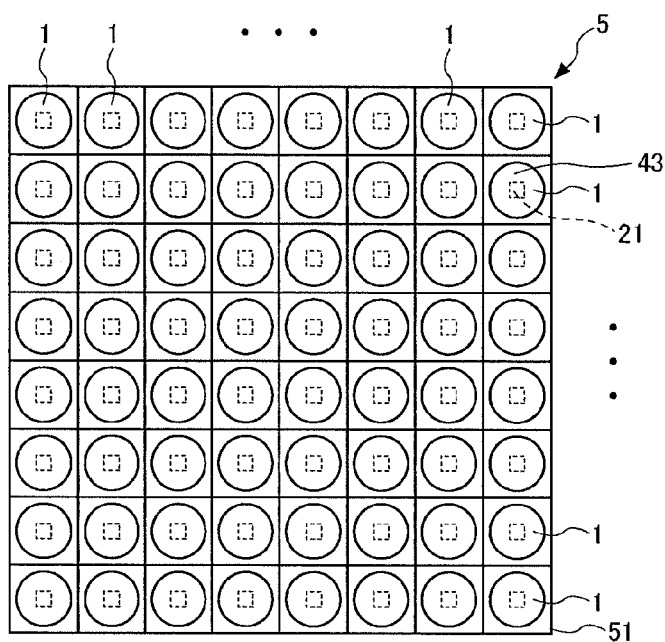
FIG. 3A is a simplified plan view showing an example of a illuminating device configured to have a tetragonal lattice arrangement.
Figure 3B:
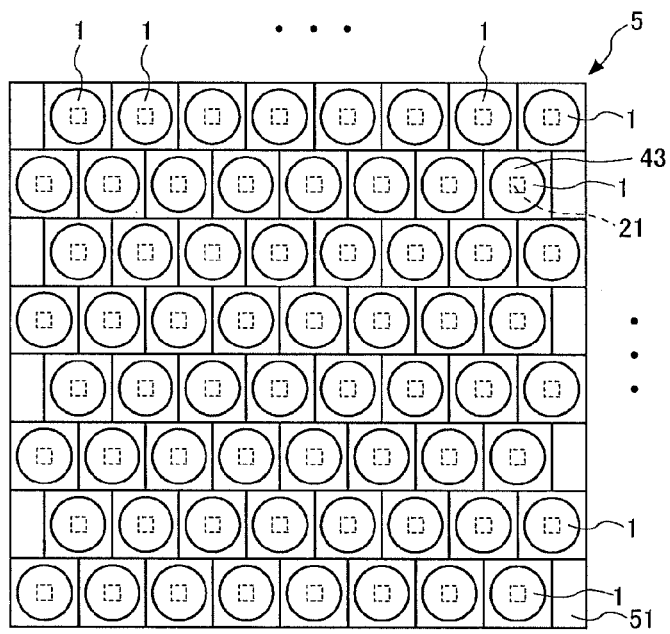
FIG. 3B is a simplified plan view showing an example of a illuminating device configured to have an arrangement in which the white light sources are shifted by ½ pitch.

As shown in FIG. 3A and FIG. 3B, in an illuminating device 5, a plurality of the white light sources 1, already explained using the FIG. 2, is arranged on an illumination board 51. The arrangement may be, for example, a tetragonal lattice arrangement as shown in FIG. 3A, or an arrangement where the white light sources are shifted, for example, by ½ pitch every other line as shown in FIG. 3B. The pitch for the shifting is not be limited to ½ pitch, but may be ⅓ pitch, or ¼ pitch. Furthermore, the white light sources may be shifted every line, or every plural lines (for example, every two lines).

Alternatively, although not illustrated, the arrangement may be an arrangement where the white light sources are shifted, for example, by ½ pitch every other column. The pitch for the shifting is not be limited to ½ pitch, but may be ⅓ pitch, or ¼ pitch. Furthermore, the white light sources may be shifted every line, or every plural lines (for example, every two lines). That is, how to shift the white light sources 1 is not limited.

The white light source 1 has a configuration similar to that which is explained with reference to the FIG. 2.

In other words, the white light source 1 has the kneaded material 43, which is obtained by kneading a red phosphor and a green phosphor into a transparent resin, on the blue light-emitting diode 21. As the red phosphor, a red phosphor represented by the composition formula (1) is used.

In the illuminating device 5, a plurality of the white light sources 1, each of which is almost equivalent to point luminescence, is arranged vertically and horizontally on the illumination board 51, whereby the illuminating device realizes the luminescence equivalent to surface luminescence, and therefore, for example, is usable as a backlight of a liquid crystal display. Also, the illuminating device 5 is usable as illuminating devices for various uses, such as a usual illuminating device, an illuminating device for photography, and an illuminating device for construction sites.

Since the illuminating device 5 uses the white light source 1, white light with a wide color gamut and brightness can be obtained. For example, when the illuminating device 5 is used as a backlight of a liquid crystal display, a pure white color with high luminance is achieved in a display screen, whereby the quality of the display screen can be improved.

5. Configuration Example of Liquid Crystal Display

Next, the liquid crystal display according to one embodiment of the present invention will be described with reference to a schematic configuration diagram shown in FIG. 4.

Figure 4:
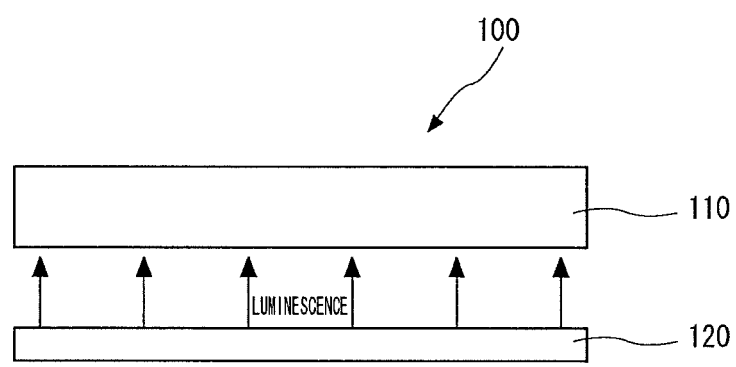
FIG. 4 is a schematic configuration diagram showing a liquid crystal display according to one embodiment of the present invention.

As shown in FIG. 4, a liquid crystal display 100 has a liquid crystal display panel 110 having a transmissive display portion, and a backlight 120 equipped with the liquid crystal display panel 110 at the back side (at a side opposite to a display surface). As the backlight 120, the illuminating device 5, already explained with reference to the FIG. 3A and the FIG. 3B, is used.

In the liquid crystal display 100, the illuminating device 5 is used as the backlight 120, and therefore the liquid crystal display panel 110 can be illuminated with white light with a wide color gamut and brightness by three primary colors of light. Therefore, in the display screen of the liquid crystal display panel 110, a pure white color with high luminance can be achieved, and color reproduction is excellent, whereby the quality of the display screen can be improved.

6. Examples

Hereinafter, Examples of the present invention will be described. Here, red phosphors, each of which has different composition, are produced, and quantum efficiency, integral values of luminescence amount, luminescence intensity, peak wavelengths, luminance, and PLE (Photo Luminescence Excitation) spectrums, of these red phosphors, were evaluated. Note that the present invention is not limited to the Examples.

[Production of Red Phosphor]

In accordance with a procedure explained using a flow chart shown in FIG. 1, a red phosphor containing an element A, europium (Eu), silicon (Si), carbon (C), oxygen (O), and nitrogen (N), at an atomic ratio of the following composition formula (1), was produced as follows.

[Chemical Formula 3]

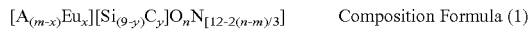

$$[A_{(m-x)}Eu_x][Si_{(9-y)}C_y]O_nN_{[12-2(n-m)/3]} \quad \text{Composition Formula (1)}$$

Note that the element A in the composition formula (1) is at least one selected from the group consisting of magnesium (Mg), calcium (Ca), strontium (Sr), and barium (Ba). Also, note that, in the composition formula (1), m, x, y, and n satisfy $3<m<5$, $0<x<1$, $0<y<9$, and $0<n<10$, respectively. Also, when each of atomic ratios of Ca, Sr, and another group 2 element is $\alpha$, $\beta$, and $\gamma$, respectively, it is satisfied that $m=\alpha+\beta+\gamma$.

First, the "raw material mixing step" S1 was performed. Here, calcium carbonate ($CaCO_3$), strontium carbonate ($SrCO_3$), europium nitride (EuN), silicon nitride ($Si_3N_4$), and melamine ($C_3H_6N_6$) were prepared. Each of the prepared raw material compounds was weighed, and mixed in an agate mortar inside a glove box in nitrogen atmosphere.

Next, the "first heat treatment step" S2 was performed. Here, the mixture is put in a crucible made of boron nitride, and a heat treatment is performed in hydrogen ($H_2$) atmosphere at 1400 degrees C. for 2 hours.

Next, the "first pulverizing step" S3 was performed. Here, the first burned material was pulverized using an agate mortar inside a glove box in nitrogen atmosphere, and then, made to pass through a #100 mesh (having an opening of approximately 200 μm) to obtain the first burned material having an average particle diameter of 3 μm or less.

Next, the "second heat treatment step" S4 was performed. Here, powder of the first burned material was put in a crucible made of boron nitride, and heat-treated in nitrogen ($N_2$) atmosphere of 0.85 MPa at 1800 degrees C. for 2 hours. Thus, a second burned material was obtained.

Next, the "second pulverizing step" S5 was performed. Here, the second burned material was pulverized using an agate mortar inside a glove box in nitrogen atmosphere. The second burned material is pulverized using a #420 mesh (having an opening of approximately 26 μm) until an average particle diameter thereof becomes approximately 3.5 μm.

By such method, impalpable powder (for example, having an average particle diameter of approximately 3.5 μm) of the red phosphor was obtained. This red phosphor was analyzed by an ICP (Inductively Coupled Plasma) emission analyzer, and, as a result, it was confirmed that the elements contained in a raw material compound and constituting the composition formula (1) were contained in the red phosphor at substantially the same molar ratio (atomic ratio).

[Evaluation of Quantum Efficiency with Respect to Ca Content]

In red phosphors ($m=3.6$, $x=0.135$, $y=0$), each of which having a calcium (Ca) content ($\alpha/(\alpha+\beta)$) of 0%, 10%, and 20%, respectively, quantum efficiency when a carbon (C) content (y) was varied was measured using a spectrophotofluorometer, FP-6500, manufactured by Jasco Corporation. Quantum efficiency of the phosphor was obtained in such a manner that phosphor powders were filled in a special cell, and irradiated with a blue excitation light having a wavelength of 450 nm, and then a fluorescence spectrum was measured. Based on the result, red quantum efficiency was calculated using a quantum efficiency measurement software which belongs to the spectrophotofluorometer.

Note that efficiency of a phosphor is represented by 3 kinds of efficiency, namely, efficiency of absorbing excitation light (absorptance), efficiency of converting the absorbed excitation light into fluorescence (internal quantum efficiency), and efficiency of converting the excitation light into fluorescence, obtained by the product of the absorptance and the internal quantum efficiency, (external quantum efficiency), and the external quantum efficiency is most important.

Figure 5:
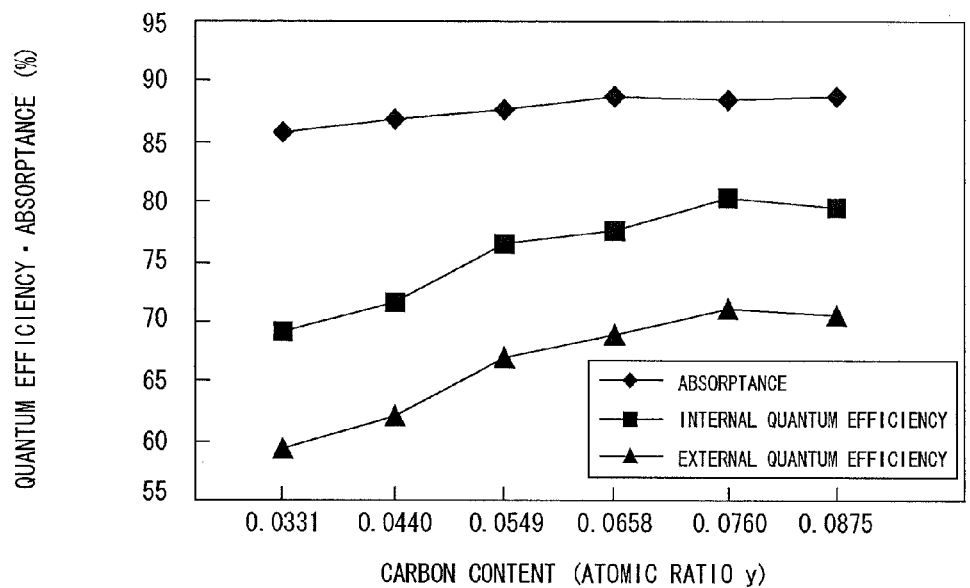
FIG. 5 is a graph showing an absorptance, an internal quantum efficiency, and an external quantum efficiency, of excitation light of a red phosphor having a Ca content of 10%.
Figure 6:
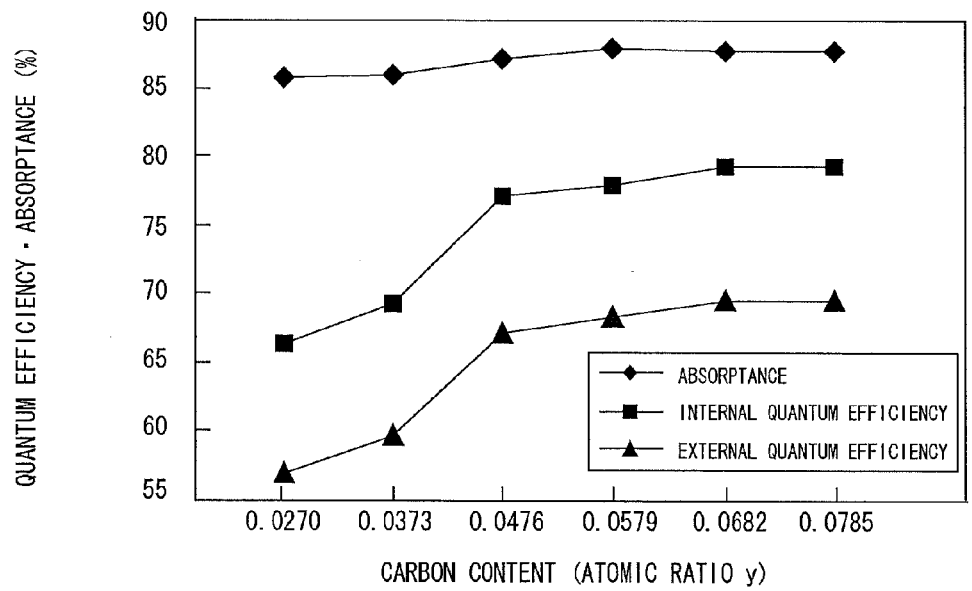
FIG. 6 is a graph showing an absorptance, an internal quantum efficiency, and an external quantum efficiency, of excitation light of a red phosphor having a Ca content of 20%.
Figure 7:
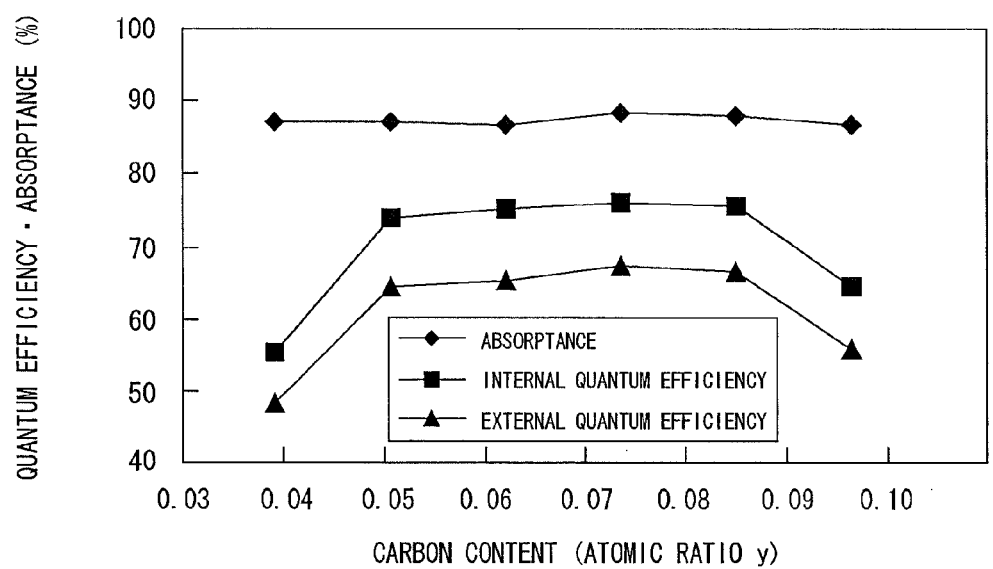
FIG. 7 is a graph showing an absorptance, an internal quantum efficiency, and an external quantum efficiency, of excitation light of a red phosphor having a Ca content of 0%.

FIG. 5 shows absorptance, internal quantum efficiency, and external quantum efficiency, with respect to excitation light, when a carbon (C) content (y) is varied in a red phosphor having a calcium (Ca) content ($\alpha/(\alpha+\beta)$) of 10% ($m=3.6$, $x=0.135$, $\alpha/(\alpha+\beta)=0.1$, $\gamma=0$). FIG. 6 shows absorptance, internal quantum efficiency, and external quantum efficiency, with respect to excitation light, when a carbon (C) content (y) is varied in a red phosphor having a calcium (Ca) content ($\alpha/(\alpha+\beta)$) of 20% ($m=3.6$, $x=0.135$, $\alpha/(\alpha+\beta)=0.2$, $\gamma=0$). FIG. 7 shows absorptance, internal quantum efficiency, and external quantum efficiency, with respect to excitation light, when a carbon (C) content (y) is varied in a red phosphor having a calcium (Ca) content ($\alpha/(\alpha+\beta)$) of 0% ($m=3.6$, $x=0.135$, $\alpha/(\alpha+\beta)=0$, $\gamma=0$).

Figure 8:
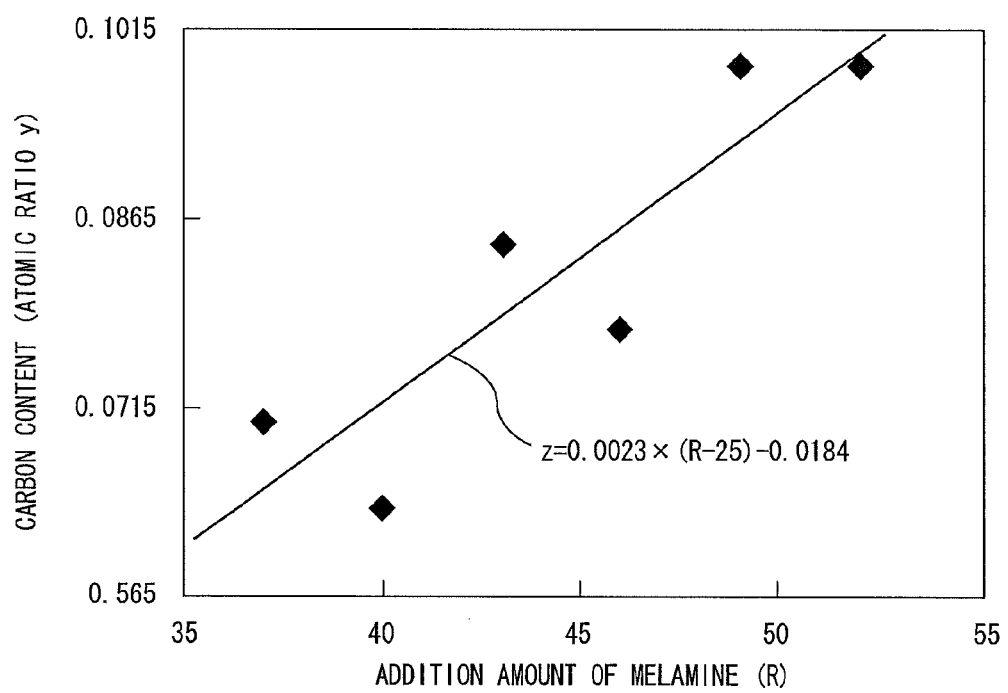
FIG. 8 is a graph showing a relation between a carbon (C) content (y) of a red phosphor obtained by analysis by an ICP emission analyzer and an addition amount R of melamine at the time of producing the red phosphor.

Note that the atomic ratio y of carbon (C) in the Example was obtained by applying an addition amount of melamine R at the time of production of each of red phosphors to a regression line. As shown in FIG. 8, the regression line is made from results obtained by analyzing a carbon (C) content (y) of a red phosphor by an ICP emission analyzer and a combustion in oxygen flow—NDIR detection method (apparatus: EMIA-U511 (manufactured by HORIBA, Ltd.)), and from an addition amount of melamine R at the time of the production of the red phosphor.

From the results shown in FIG. 5 to FIG. 7, it was confirmed that, in a red phosphor containing calcium (Ca) in the element A, higher external quantum efficiency was achieved than in a red phosphor not containing calcium (Ca) in the element A.

Furthermore, as shown in FIG. 5 and FIG. 6, it was confirmed that, in the red phosphor containing calcium (Ca) in the element A, as a calcium (Ca) content ($\alpha/(\alpha+\beta)$) became larger, namely, 10% and then 20%, a carbon (C) content (y) increased, whereby a result that external quantum efficiency exceeded 65% was brought. This is considered because, in accordance with the increase in a calcium (Ca) content ($\alpha/(\alpha+\beta)$), a content of carbon (C), which should be contained in the phosphor in order to acquire a high luminous efficiency, increased.

On the other hand, as shown in FIG. 7, in the red phosphor not containing calcium (Ca) in the element A ($\alpha/(\alpha+\beta)=0$), even if a carbon (C) content (y) was made to increase, a result that external quantum efficiency exceeded 65% was not obtained. This is considered because, oxygen (O) was removed without varying a content of carbon (C), which should be contained in a phosphor in order to acquire a high luminous efficiency.

[Evaluation of Integral Value of Luminescence Amount, Peak Wavelength, and Emission Spectrum, with Respect to Ca Content]

Next, integral values of luminescence amount, peak wavelengths, and an emission spectrums, of red phosphors ($m=3.6$, $x=0.135$, $\gamma=0$), each of which having different calcium (Ca)

contents, were measured by irradiating 450 nm excitation light, using a spectrophotometer (FLUOROLOG3 manufactured by SPEX).

Figure 9:
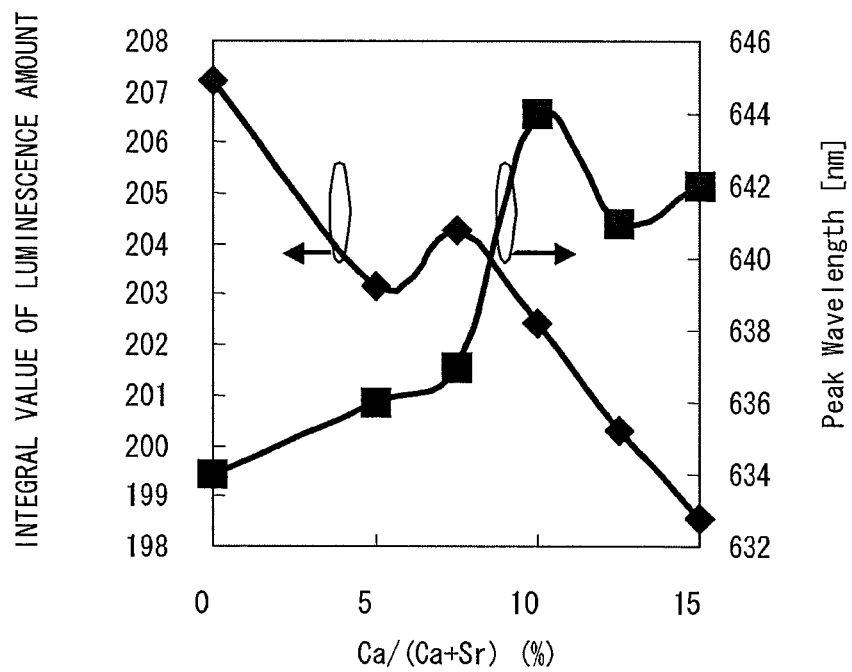
FIG. 9 is a graph showing an integral value of luminescence amount of a red phosphor, and a peak wavelength thereof, when a Ca content is varied while a C content is fixed.
Figure 10:
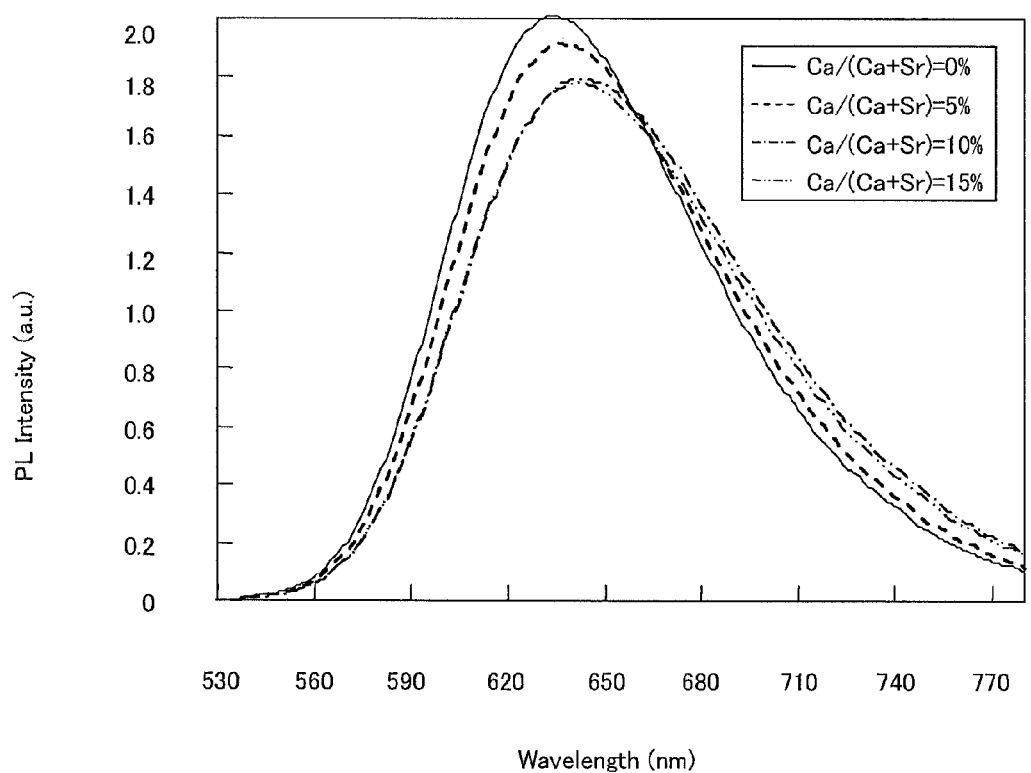
FIG. 10 is an emission spectrum of a red phosphor, when a Ca content is varied while a C content is fixed.

FIG. 9 shows integral values of luminescence amount and peak wavelengths, of red phosphors, when a calcium (Ca) content ($\alpha/(\alpha+\beta)$) was varied to 0%, 5%, 7.5%, 10%, 12.5%, and 15% while an amount of melamine (y=0.0739) was fixed. FIG. 10 shows emission spectrums of these red phosphors.

Figure 11:
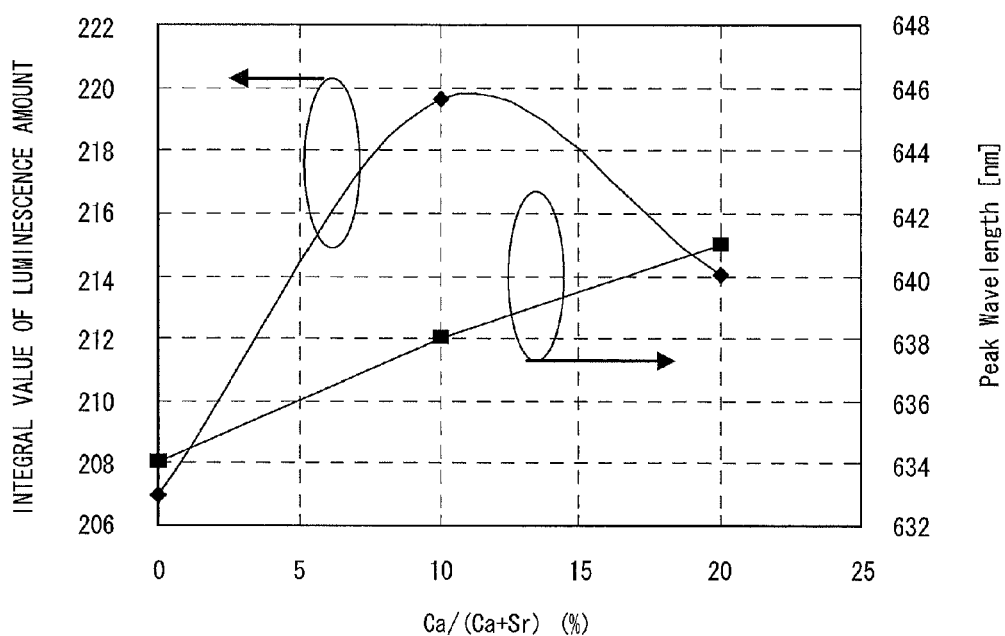
FIG. 11 is a graph showing integral values of luminescence amount and peak wavelengths of a red phosphor when a Ca content is 0% (y=0.0739), 10% (y=0.0851), and 20% (y=0.0851).
Figure 12:
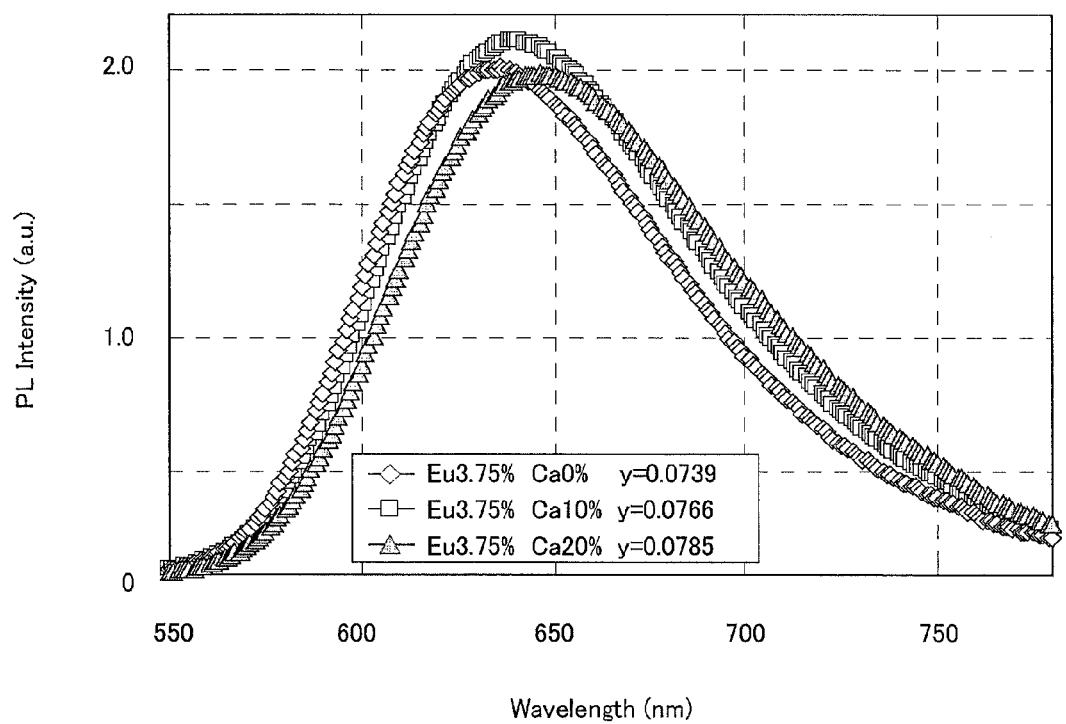
FIG. 12 is an emission spectrum of a red phosphor when a Ca content is 0% (y=0.0739), 10% (y=0.0851), and 20% (y=0.0851).

FIG. 11 shows integral values of luminescence amount and peak wavelengths, of red phosphors, when a calcium (Ca) content ($\alpha/(\alpha+\beta)$) was varied to 0% (y=0.0739), 10% (y=0.0766), and 20% (y=0.0785). FIG. 12 shows emission spectrums of these red phosphors.

As shown in FIG. 9 and FIG. 10, when a calcium (Ca) content ($\alpha/(\alpha+\beta)$) was increased while an amount of melamine (y=0.0739) was fixed, an integral value of luminescence amount tended to decrease. On the other hand, as shown in FIG. 11 and FIG. 12, it was found that, when an amount of melamine was increased (y=0.0739→y=0.0785) in accordance with an increase in a calcium (Ca) content ($\alpha/(\alpha+\beta)$), an integral value of luminescence amount tended to increase.

[Evaluation of Peak Wavelength and Luminance with Respect to C Content (y)]

Next, regarding red phosphors (m=3.6, x=0.135, γ=0), each of which having a calcium (Ca) content ($\alpha/(\alpha+\beta)$) of 0%, 10%, and 20%, respectively, peak wavelengths and luminance thereof when an amount of melamine was varied were measured by irradiating 450 nm excitation light, using a spectrophotometer (FLUOROLOG3 manufactured by SPEX).

Figure 13:
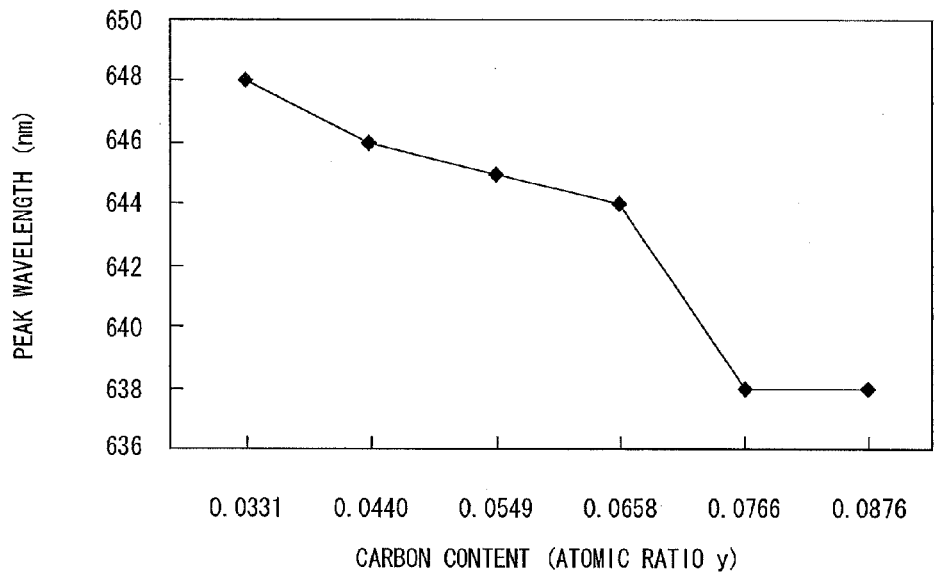
FIG. 13 is a graph showing a peak wavelength when a carbon (C) content (y) is varied in a red phosphor having a Ca content of 10%.
Figure 14:
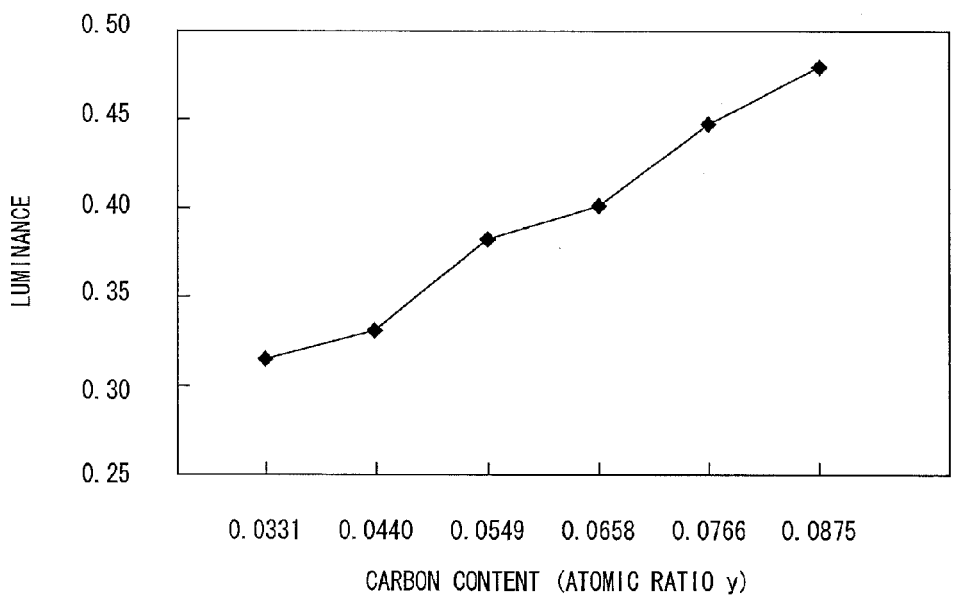
FIG. 14 is a graph showing a luminance when a carbon (C) content (y) is varied in a red phosphor having a Ca content of 10%.
Figure 15:
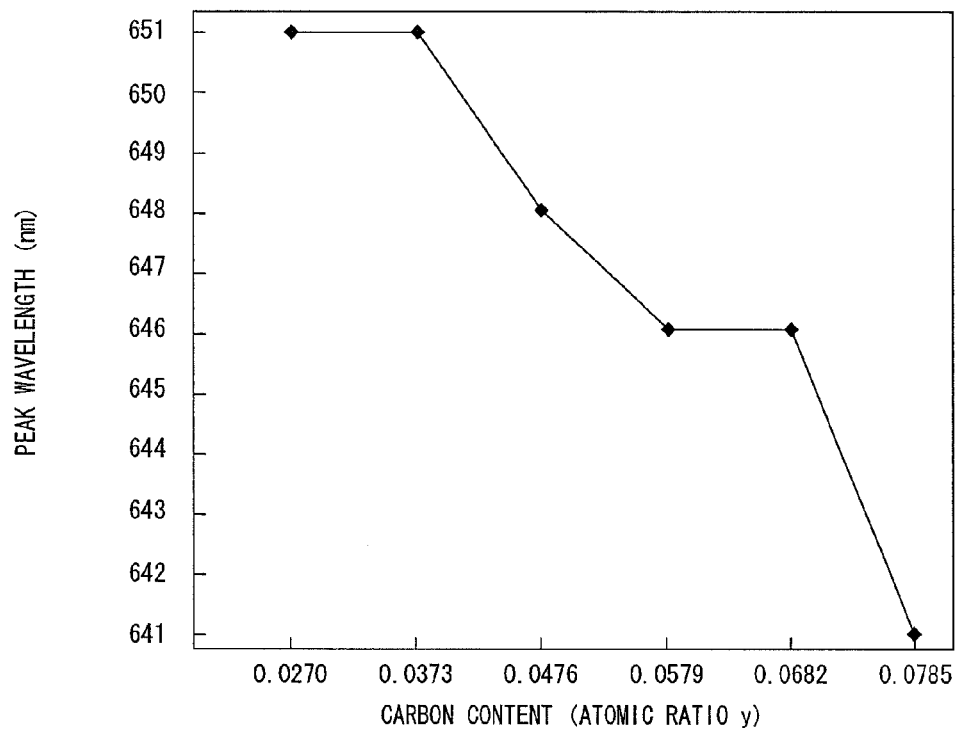
FIG. 15 is a graph showing a peak wavelength when a carbon (C) content (y) is varied in a red phosphor having a Ca content of 20%.
Figure 16:
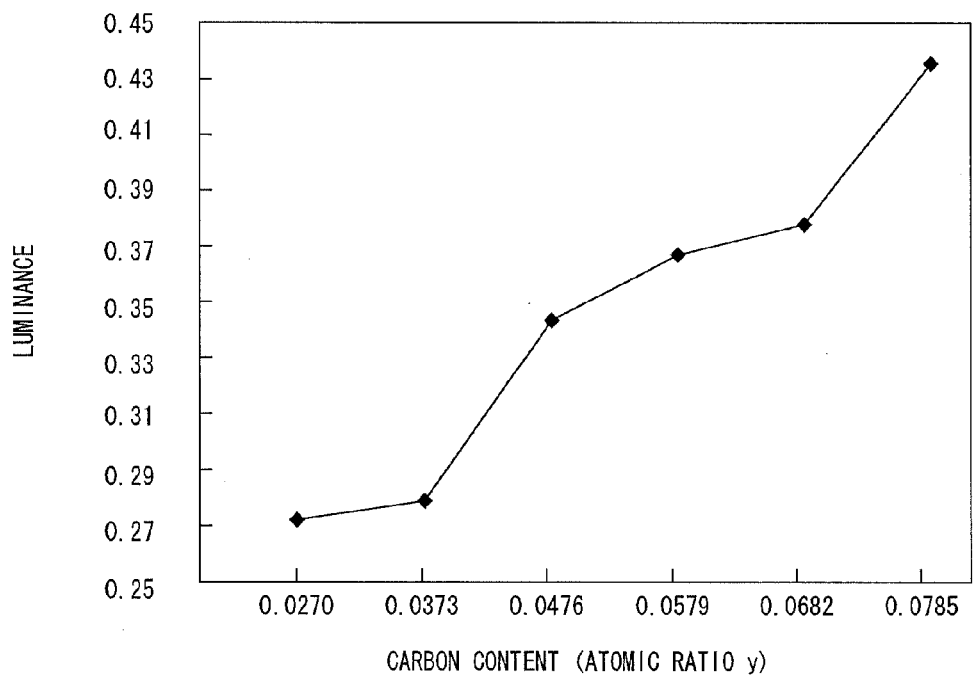
FIG. 16 is a graph showing a luminance when a carbon (C) content (y) is varied in a red phosphor having a Ca content of 20%.
Figure 17:
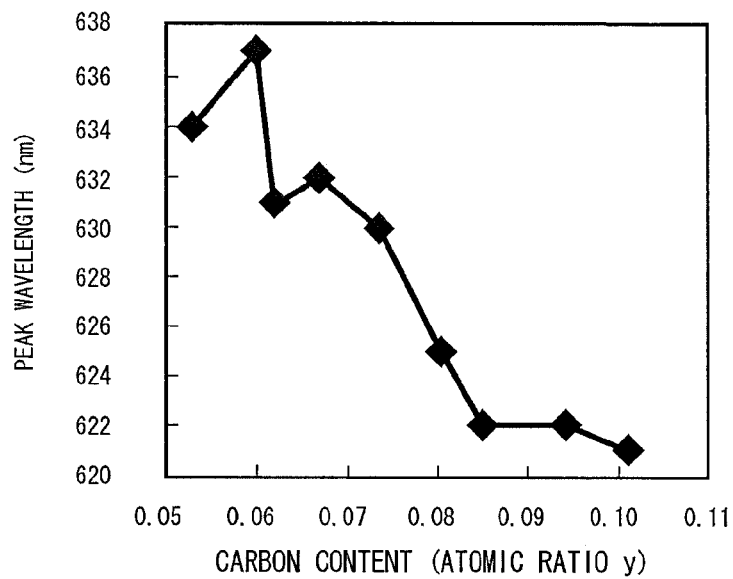
FIG. 17 is a graph showing a peak wavelength when a carbon (C) content (y) is varied in a red phosphor having a Ca content of 0%.

FIG. 13 shows a peak wavelength of a red phosphor having a calcium (Ca) content ($\alpha/(\alpha+\beta)$) of 10% when an amount of melamine is varied, and FIG. 14 shows the luminance. FIG. 15 shows a peak wavelength of a red phosphor having a calcium (Ca) content ($\alpha/(\alpha+\beta)$) of 20% when an amount of melamine is varied, and FIG. 16 shows the luminance. FIG. 17 shows a peak wavelength of a red phosphor having a calcium (Ca) content ($\alpha/(\alpha+\beta)$) of 0% when an amount of melamine is varied, and FIG. 18 shows the luminance.

As shown in FIG. 13, FIG. 15, and FIG. 17, it was observed that, as a calcium (Ca) content ($\alpha/(\alpha+\beta)$) increased, a peak wavelength tended to shift to a longer wavelength side. Also, it was observed that, as a carbon (C) content (y) depending on an amount of melamine increased, a peak wavelength tended to shift to a shorter wavelength side. In other words, it was found that, a peak wavelength was adjustable by a calcium (Ca) content ($\alpha/(\alpha+\beta)$) and a carbon (C) content (y).

Figure 18:
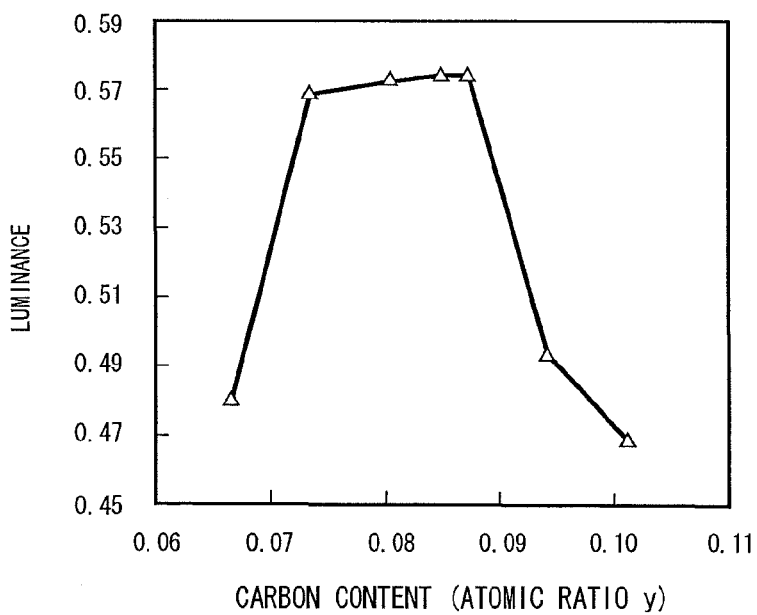
FIG. 18 is a graph showing a luminance when a carbon (C) content (y) is varied in a red phosphor having a Ca content of 0%.

As shown in FIG. 14, FIG. 16, and FIG. 18, it was observed that, as a calcium (Ca) content ($\alpha/(\alpha+\beta)$) increased, luminance tended to decrease. Also, it was observed that, as a content (y) of carbon (C) depending on an amount of melamine increased, luminance tended to be higher.

[Relation Between C Content (y) and PLE]

PLE (Photo Luminescence Excitation) spectrum is a spectrum which shows, with focusing on PL intensity of a specific energy, how the intensity varies when excitation wavelength is varied. The inventors obtained a finding that a content of carbon (C), which should be contained in a phosphor in order to obtain high luminous efficiency, has a relation to the specified emitting characteristic of a PLE spectrum.

Figure 19:
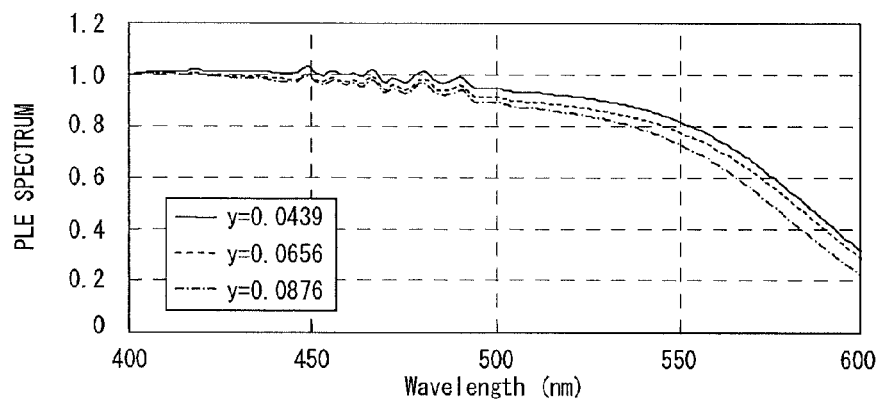
FIG. 19 is a PLE spectrum when a luminescence intensity of 400 nm excitation wavelength of a red phosphor having a Ca content of 10% is defined as 1.
Figure 20:
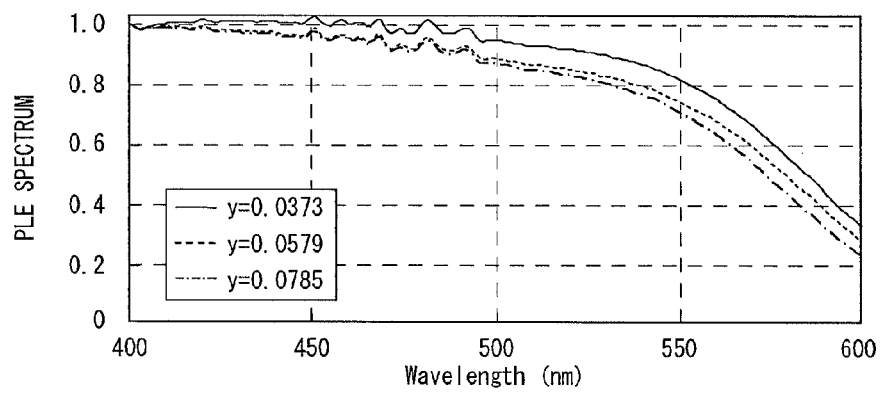
FIG. 20 is a PLE spectrum when a luminescence intensity of 400 nm excitation wavelength of a red phosphor having a Ca content of 20% is defined as 1.
Figure 21:
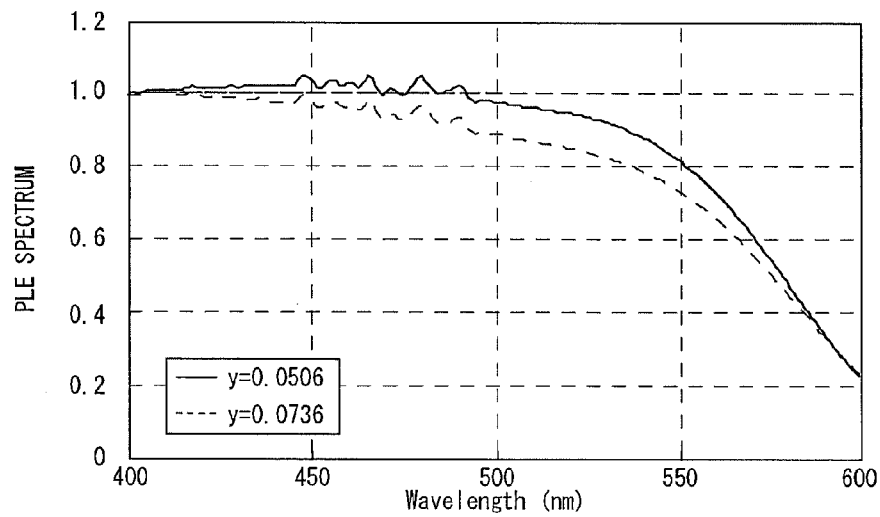
FIG. 21 is a PLE spectrum when a luminescence intensity of 400 nm excitation wavelength of a red phosphor having a Ca content of 0% is defined as 1.

FIG. 19 is a PLE spectrum when a luminescence intensity of 400 nm excitation wavelength of a red phosphor (m=3.6, x=0.135, γ=0) having a Ca content ($\alpha/(\alpha+\beta)$) of 10% is defined as 1. FIG. 19 shows PLE spectrums of each of red phosphors having a carbon (C) content of 0.0506, 0.0656 and 0.0876, respectively, the carbon (C) content depending on an amount of melamine. FIG. 20 is a PLE spectrum when a luminescence intensity of 400 nm excitation wavelength of a red phosphor (m=3.6, x=0.135, γ=0) having a Ca content ($\alpha/(\alpha+\beta)$) of 20% is defined as 1. FIG. 20 shows PLE spectrums of each of red phosphors having a carbon (C) content of 0.0506, 0.0579, and 0.0785, respectively, the carbon (C) content depending on an amount of melamine. FIG. 21 is a PLE spectrum when a luminescence intensity of 400 nm excitation wavelength of a red phosphor (m=3.6, x=0.135, γ=0) having a Ca content ($\alpha/(\alpha+\beta)$) of 0% is defined as 1. FIG. 21 shows PLE spectrums of each of red phosphors having a carbon (C) content of 0.0506 and 0.0736, respectively, the carbon (C) content depending on an amount of melamine.

In the PLE spectrums shown in FIG. 19 to FIG. 21, a relative value of luminescence intensity of 550 nm excitation wavelength when a luminescence intensity of 400 nm excitation wavelength is defined as 1 tends to decrease as a carbon (C) content (y) depending on an amount of melamine increases. That is, in a PLE spectrum, a range of not more than 0.82 and not less than 0.70 of a relative value of luminescence intensity of 550 nm excitation wavelength when a luminescence intensity of 400 nm excitation wavelength is defined as 1 can be converted into a range of a carbon (C) content (y) of not less than 0.012 and not more than 0.10, the carbon (C) content (y) depending on an amount of melamine.

That is, it was found that, in a PLE spectrum, a relative value of luminescence intensity of 550 nm excitation wavelength when a luminescence intensity of 400 nm excitation wavelength is defined as 1 was in a range of not more than 0.82, preferably not more than 0.82 and not less than 0.70, whereby a higher integral value of luminescence amount was obtainable.

[Structure of Red Phosphor]

Figure 22:
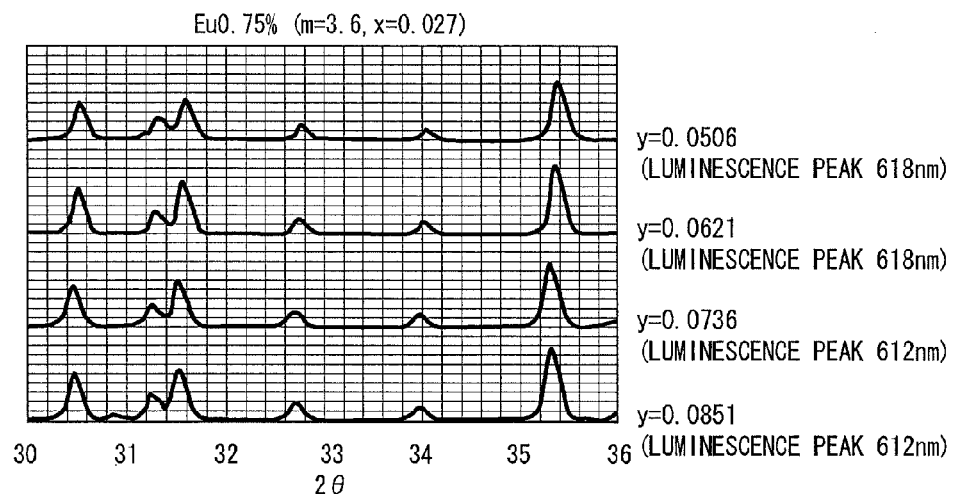
FIG. 22 is a spectrum of XRD analysis of a red phosphor (Spectrum 1).
Figure 23:
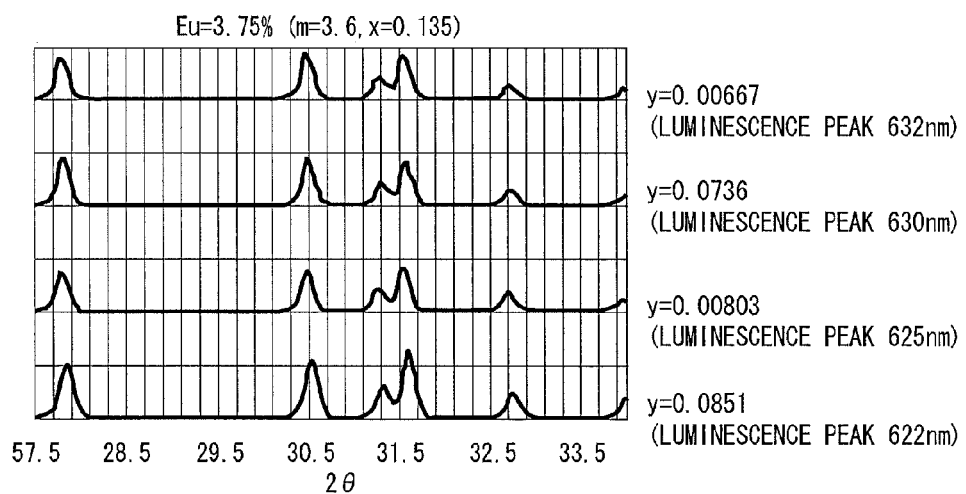
FIG. 23 is a spectrum of XRD analysis of a red phosphor (Spectrum 2).

FIG. 22 and FIG. 23 show results of XRD analyses of each of red phosphors (α=0) represented by the composition formula (1). As shown in these Figs., it is confirmed that, depending on a carbon (C) content (atomic ratio y), peak positions which appear in each diffraction angle (2θ) shift. For example, as a carbon (C) content (atomic ratio y) increases, a peak around a diffraction angle, 2θ=35.3, shifts in a direction where an diffraction angle (2θ) is smaller, then shifts in a direction where an diffraction angle (2θ) is larger.

From the results of FIGS. 22 and 23, it was confirmed that, in each of red phosphors represented by the composition formula (1), a-axis and c-axis in an orthorhombic space group Pmn21 extended and shrank depending on a carbon (C) content (atomic ratio y), whereby a lattice volume expanded and shrank. Note that b-axis hardly varies.

Thus, it is confirmed that carbon which exists in a red phosphor (C) is replaced with silicon (Si) so as to constitute a part of the above-mentioned single crystal, whereby lattice spacing in the single crystal varies. That is, it was confirmed that carbon (C) existed in a red phosphor consisted of the above-mentioned single crystal so as to constitute a part of the single crystal. Also, the produced red phosphor was in good coincidence with a model of an orthorhombic space group Pmn21 determined by Rietveld analysis.

Note that, although these results are related to a red phosphor (α=0) which does not contain calcium (Ca) in the composition formula (1), similar results are obtainable from a red phosphor (α>0) which contains calcium (Ca).

DESCRIPTION OF THE NUMERALS

1 . . . white light source, 5 . . . illuminating device, 21 . . . blue light-emitting diode, 43 . . . kneaded material, 100 . . . liquid crystal display, 110 . . . liquid crystal display panel, 120 . . . backlight (illuminating device 5)

The invention claimed is:

1. A red fluorescent material containing an element A, europium (Eu), silicon (Si), carbon (C), oxygen (O), and nitrogen (N), at an atomic ratio of the following composition formula (1):

$$[A_{(m-x)}Eu_x][Si_{(9-y)}C_y]O_nN_{[12-2(n-m)/3]},$$

wherein the element A is an group 2 element including at least calcium (Ca) and strontium (Sr), when, each of atomic ratios of Ca, Sr, and another group 2 element is α, β, and γ, respectively (m=α+β+γ), a relation of 0<α/(α+β)≤0.2 is satisfied; and m, x, y, and n satisfy 3<m<5, 0<x<1, 0<y<9, and 0<n<10, respectively.

2. The red fluorescent material according to claim 1, wherein, in the composition formula (1), a relation of 0.012≤y≤0.10 is satisfied.

3. The red fluorescent material according to claim 1, wherein, in a PLE (Photo Luminescence Excitation) spectrum, a relative value of a luminescence intensity of 550 nm excitation wavelength when a luminescence intensity of 400 nm excitation wavelength is defined as 1 is not more than 0.82.

4. A method for producing a red fluorescent material, comprising:
mixing a carbonate compound of an element A, europium nitride, silicon nitride, and melamine to form a mixture so that the element A, europium (Eu), silicon (Si), carbon (C), oxygen (O), and nitrogen (N) are contained at an atomic ratio of the following composition formula (1):

$$[A_{(m-x)}Eu_x][Si_{(9-y)}C_y]O_nN_{[12-2(n-m)/3]},$$

wherein the element A is a group 2 element including at least calcium (Ca) and strontium (Sr), wherein, when, each of atomic ratios of Ca, Sr, and another group 2 element is α, β, and γ, respectively (m=α+β+γ), a relation of 0<α/(α+β)≤0.2 is satisfied, and wherein m, x, y, and n satisfy 3<m<5, 0<x<1, 0<y<9, and 0<n<10, respectively;

burning the mixture to form a burned material; and
pulverizing the burned material.

5. The method for producing a red fluorescent material according to claim 4, further comprising:
burning the pulverized burned material to form a second burned material; and
pulverizing the second burned material.

6. A white light source, comprising:
a blue light-emitting diode formed on an element substrate; and
a kneaded material which is obtained by kneading a red phosphor and a green phosphor with a transparent resin and is arranged on the blue light-emitting diode, the red phosphor containing an element A, europium (Eu), silicon (Si), carbon (C), oxygen (O), and nitrogen (N) at an atomic ratio of the following composition formula (1):

$$[A_{(m-x)}Eu_x][Si_{(9-y)}C_y]O_nN_{[12-2(n-m)/3]},$$

wherein the element A is a group 2 element including at least calcium (Ca) and strontium (Sr), wherein, when, each of atomic ratios of Ca, Sr, and another group 2 element is α, β, and γ, respectively (m=α+β+γ), a relation of 0<α/(α+β)≤0.2 is satisfied, and wherein m, x, y, and n satisfy 3<m<5, 0<x<1, 0<y<9, and 0<n<10, respectively.

* * * * *